United States Patent
Demaray et al.

(10) Patent No.: US 6,533,907 B2
(45) Date of Patent: Mar. 18, 2003

(54) METHOD OF PRODUCING AMORPHOUS SILICON FOR HARD MASK AND WAVEGUIDE APPLICATIONS

(75) Inventors: Richard E. Demaray, Portola Valley, CA (US); Jesse Shan, San Jose, CA (US); Kai-An Wang, Cupertino, CA (US); Ravi B. Mullapudi, San Jose, CA (US)

(73) Assignee: Symmorphix, Inc., Sunnyvale, CA (US)

(*) Notice: Subject to any disclaimer, the term of this patent is extended or adjusted under 35 U.S.C. 154(b) by 0 days.

(21) Appl. No.: 09/766,463

(22) Filed: Jan. 19, 2001

(65) Prior Publication Data

US 2002/0134671 A1 Sep. 26, 2002

(51) Int. Cl.$^7$ ................................................. C23C 14/34
(52) U.S. Cl. .............................. 204/192.25; 204/192.12
(58) Field of Search ..................... 204/192.12, 192.23, 204/192.25; 216/51, 24, 39

(56) References Cited

U.S. PATENT DOCUMENTS

| | | | |
|---|---|---|---|
| 4,978,437 A | * 12/1990 | Wirz | 204/192.23 |
| 5,107,538 A | 4/1992 | Benton et al. | 385/130 |
| 5,119,460 A | 6/1992 | Bruce et al. | 385/142 |
| 5,206,925 A | 4/1993 | Nakazawa et al. | 385/142 |
| 5,252,194 A | 10/1993 | Demaray et al. | 204/298.2 |
| 5,303,319 A | 4/1994 | Ford et al. | 385/131 |
| 5,381,262 A | 1/1995 | Arima et al. | 359/341 |
| 5,475,528 A | 12/1995 | LaBorde | 359/341 |
| 5,483,613 A | 1/1996 | Bruce et al. | 385/129 |
| 5,555,127 A | 9/1996 | Abdelkader et al. | 359/341 |
| 5,563,979 A | 10/1996 | Bruce et al. | 385/142 |
| 5,565,071 A | 10/1996 | Demaray et al. | 204/192.12 |
| 5,603,816 A | 2/1997 | Demaray et al. | 204/298.07 |
| 5,613,995 A | 3/1997 | Bhandarkar et al. | 65/384 |
| 5,719,976 A | 2/1998 | Henry et al. | 385/50 |
| 5,831,262 A | 11/1998 | Greywall et al. | 250/227.14 |
| 5,841,931 A | 11/1998 | Foresi et al. | 385/131 |
| 5,847,865 A | 12/1998 | Gopinath et al. | 359/343 |
| 5,855,744 A | 1/1999 | Halsey et al. | 204/192.12 |
| 5,900,057 A | 5/1999 | Buchal et al. | 117/109 |
| 5,966,491 A | 10/1999 | DiGiovanni | 385/127 |
| 6,080,643 A | * 6/2000 | Noguchi et al. | 438/487 |
| 6,157,765 A | 12/2000 | Bruce et al. | 385/129 |

FOREIGN PATENT DOCUMENTS

| | | | |
|---|---|---|---|
| EP | 0867 985 A1 | 9/1998 | H01S/3/06 |
| WO | WO 00/21898 | 4/2000 | C03C/13/04 |
| WO | WO 00/22742 | 4/2000 | G02B/6/26 |

OTHER PUBLICATIONS

JP 2–54764 English Abstract.*

Asghari et al., "ASOC—A Manufacturing Integrated Optics Technology," Part of the SPIE Conference on Integrated Optics Devices III, vol. 3620, pp. 252–262 (Jan. 1999).

Bestwick, T., "ASOC silicon integrated optics technology," Part of the SPIE Conferences on Photonics Packaging and Integration, SPIE vol. 3631, pp. 182–190 (Jan. 1999).

Choi et al., "Er–Al–codoped silicate planar light waveguide– type amplifier fabricated by radio–frequency sputtering," Optics Letters, vol. 25, No. 4, pp. 263–265 (Feb. 15, 2000).

Horst et al., "Compact, Tunable Optical Devices in Silicon–Oxynitride Wave Guide Technology," IBM Research Division, 3 pages (1999).

Hübner, J. and Guldberg–Kjaer, S., "Planar Er–and Yb–Doped Amplifiers and Lasers," COM Technical University of Denmark, 10$^{th}$ European Conf. On Integrated Optics, Session WeB2, pp. 71–74 (2001).

Kato et al., "Recent progress on PLC hybrid integration," Part of the SPIE Conference on Optoelectric Integrated Circuits III, SPIE. vol. 3631, pp. 28–36 (Jan. 1999).

Ladouceur, F. et al., "Effect of side wall roughness in buried channel waveguides," IEEE Proc., vol. 141, pp. 242–248 (Aug. 1994).

Laurent–Lund, C. et al., "PECVD Grown Multiple Core Planar Waveguides with Extremely Low Interface Reflections and Losses," IEEE Photonics Technology Letters vol. 10, No. 10, pp. 1431–1433 (Oct. 1998).

Marques, P.V.S. et al., "Planar Silica–on–Silicon Waveguide Lasers Based in Two Layer Core Devices," 10$^{th}$ European Conference on Integrated Optics, Session WeB2, pp. 79–82 (2001).

(List continued on next page.)

Primary Examiner—Steven H. VerSteeg
(74) Attorney, Agent, or Firm—Skjerven Morrill LLP; Gary J. Edwards

(57) ABSTRACT

A specialized physical vapor deposition process provides dense amorphous semiconducting material with exceptionally smooth morphology. In particular, the process provides dense, smooth amorphous silicon useful as a hard mask for etching optical and semiconductor devices and as a high refractive index material in optical devices. DC sputtering of a planar target of intrinsic crystalline semiconducting material in the presence of a sputtering gas under a condition of uniform target erosion is used to deposit amorphous semiconducting material on a substrate. DC power that is modulated by AC power is applied to the target. The process provides dense, smooth amorphous silicon at high deposition rates. A method of patterning a material layer including forming a hard mask layer of amorphous silicon on a material layer according to the present DC sputtering process is also provided. The low average surface roughness of the amorphous silicon hard mask is reflected in the low average surface roughness of the sidewalls of the etched material layer. In addition, a method of forming optical devices in which the DC sputtered amorphous semiconductor materials are used as the high refractive index material is provided.

4 Claims, 6 Drawing Sheets

OTHER PUBLICATIONS

Ohkubo et al., "Polarization–Insensitive Arrayed–Waveguide Grating Using Pure Si)2 Cladding," Fifth Optoelectronics and Communication Conference (OECC 2000) Technical Digest, 2 pages (Jul. 2000).

Ono et al., "Design of a Low–loss Y–branch Optical Waveguide," Fifth Optoelectronic and Communications Conference (OECC 2000) Technical Digest, 2 pages (Jul. 2000).

Roberts et al., "The Photoluminescence of Erbium–doped Silicon Monoxide," Department of Electronics and Computer Science, 7 pages (Jun. 1996).

Schermer, R. et al., "Investigation of Mesa Dielectric Waveguides,", *Proceedings of the OSA Integrated Photonics Research Topical Meeting and Exhibit*, Paper No. IWB3 (Jun. 11, 2001).

Shmulovich et al., "Recent progress in Erbium–doped waveguide amplifiers," Bell Laboratories, 3 pages (1999).

Tervonen, A., "Challenges and opportunities for integrated optics in optical networks," Part of the SPIE Conference in Integrated Optics Devices III, SPIE vol. 3620, pp. 2–11 (Jan. 1999).

Ting et al., "Study of planarized sputter–deposited SiO2," *J. Vac. Sci. Technol.*, 15(3) pp. 1105–1112 (May/Jun. 1978).

Kevin K. Lee, [a)] Desmond R. Lim, Hsin–Chiao Luan, Anuradha Agarwal, James Foresi and Lionel C. Kimerling, Effect of size and roughness on light transmission in a $S/SiO_2$ waveguide: Experiments and model, *Department of Materials Science and Engineering, Massachusetts Institute of Technology*, Jul. 12, 2000.

* cited by examiner

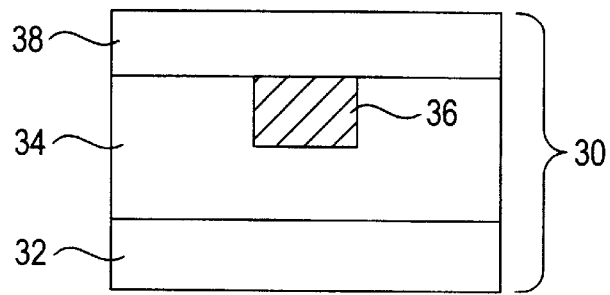
FIG. 2a
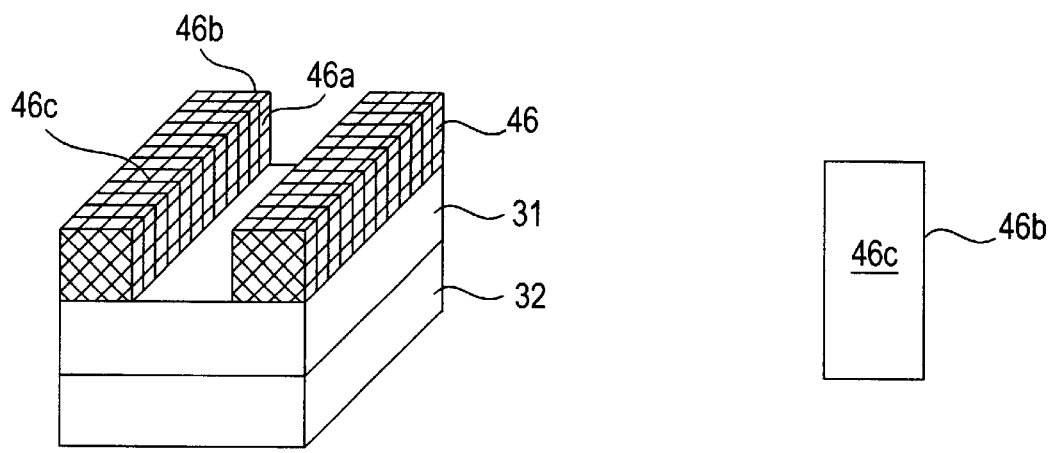
FIG. 2b
FIG. 2c
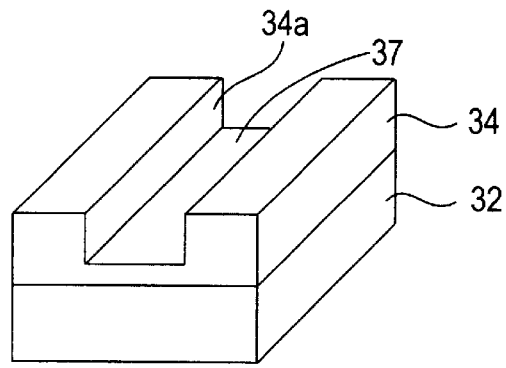
FIG. 2d

METHOD OF PRODUCING AMORPHOUS SILICON FOR HARD MASK AND WAVEGUIDE APPLICATIONS

FIELD OF THE INVENTION

This invention relates generally to amorphous semiconducting materials, and, in particular, to a method of making amorphous silicon material that is dense, smooth, and uniform for use as a hard mask and to form waveguide structures.

BACKGROUND

Amorphous silicon has a variety of uses in semiconductor and optical device fabrication. Amorphous silicon is conventionally produced by low pressure chemical vapor deposition (LPCVD), using silane, $SiH_4$, as a reactant gas. To produce amorphous silicon, the deposition temperature is kept below about 580° C. At temperatures of about 580° C. or above, LPCVD of silane produces polysilicon.

One potential use of amorphous silicon is as a hard mask material during an etching step in the fabrication of integrated circuit devices, optical devices or solid state lasers. Silicon-based materials have been widely used as hard masks for semiconductor fabrication. Materials such as silicon carbide, silicon nitride, and metal suicides are usually provided by CVD methods for use as hard masks. However, there are significant differences between the requirements on the hard mask for etching typical integrated circuits and the requirements for etching optical devices. In semiconductor applications, the layers being etched are typically shallow, less than several thousand angstroms in thickness, while in optical devices, the layers being etched are typically more than a micron in thickness. The deeper the structure being etched, the thicker the hard mask that is needed. Further, optical devices have much more stringent requirements for the smoothness of etched sidewalls to avoid insertion losses when, for example, an optical amplifier is coupled to an optical fiber.

In etching silicon oxide, a material widely used in optical devices, any species other than silicon is a contaminant whose presence can also compromise device performance. Amorphous silicon is attractive as a hard mask material for fabricating optical devices in that it does not contain any contaminant species. However, CVD deposited amorphous silicon shares the drawbacks of all the CVD deposited hard mask materials. CVD deposition processes are relatively slow. For example, a deposition rate for amorphous silicon of 2.5 nm/min at 550° C. has been reported (C. Y. Chang and S. M. Sze, Eds. ULSI Technology, Mc-Graw Hill, N.Y., 1996.) At such low rates, the time required to build up the thick hard mask layer needed for optical device fabrication may be unacceptably long. In addition as the hard mask layer is built up by CVD deposition, the surface roughness tends to increase. CVD deposited amorphous silicon has from several percent to as much as 8–10% atomic hydrogen which has the effect of decreasing density and increasing porosity. Thus, CVD amorphous silicon has a rough sidewall, due to its native morphology, which gets rougher as it is used as a hard mask. Surface roughness is undesirably transferred to the sidewall of the etched structure, which, as presented above, compromises optical device performance. The drawbacks affecting optical fabrication may also pose difficulties in the fabrication of integrated circuit devices as feature sizes of devices continue to shrink.

Another potential use of amorphous silicon is as a layer of high index of refraction material in a light wave guiding structure. Silicon has a very high refractive index, on the order of 3.4, giving a difference in refractive index of about 2 with respect to silicon dioxide. With such a large difference in refractive index, a $Si/SiO_2$ waveguide is strongly guiding providing micron sized optical devices such as splitters, resonators, and switches. A waveguide composed of silicon and $SiO_2$ could be formed on silicon wafers and readily integrated with microelectronic integrated circuits.

One attempt at forming an optical interconnection for silicon integrated circuits has been reported in U.S. Pat. No. 5,841,931 to Foresi et al., incorporated herein by reference. Foresi et al. disclose the use of polycrystalline silicon to form the core of a waveguide device. They report that surface roughness limits device performance and teach fabricating an optical device by polishing a polycrystalline silicon layer to reduce surface roughness. For example, Foresi et al. report transmission loss of a waveguide containing polysilicon polished by chemical mechanical polishing (CMP) of less than 35 db/cm, a loss rate which is too high to be useful commercially. In a study of $Si/SiO_2$ waveguides with a single crystalline silicon core on a Silicon-on-Insulator (SOI) platform, Lee et al. (Appl. Phys. Lett. 77, 1617 (2000)) report the major source of loss comes from silicon sidewall roughness and that the contribution of sidewall roughness to transmission loss increases as the width of the waveguide core is reduced. For a silicon core waveguide with a surface roughness standard deviation of 9 nm, measured for the SOI system, Lee et al. observed a transmission loss greater than 30 db/cm, in agreement with theory.

Thus, to date, surface roughness of silicon is a limiting factor in using pure silicon materials as hard mask layers or as a component of optical devices.

SUMMARY

A specialized physical vapor deposition process provides dense amorphous semiconducting material with exceptionally smooth morphology. In particular, the process provides dense, smooth amorphous silicon useful as a hard mask for etching optical and semiconductor devices and as a high refractive index material in optical devices.

According to a first aspect of the present invention, DC sputtering of a planar target of intrinsic crystalline semiconducting material in the presence of a sputtering gas under a condition of uniform target erosion is used to deposit amorphous semiconducting material on a substrate. Uniform target erosion may be obtained by providing a time-averaged uniform magnetic field by scanning a magnetron source across the target in a plane parallel to the plane of the target. The substrate is positioned opposite the target and DC power that is modulated by AC power is applied to the target creating a plasma. The DC power is supplied by a switching DC power supply including one or more silicon control rectifiers. Switching on an SCR typically provides a low frequency AC ripple superimposed on the DC current at a power level of between about 5 and 10% of the total power, resulting in substantial stored energy in the plasma in the chamber at multiples of the switching frequency. Alternatively, a separate discrete source of low frequency AC power is coupled to the DC power supply. The AC power component yields a high sputtering rate at low applied DC voltage and adds a low frequency component to the plasma which causes ions in the plasma to bombard the film being deposited resulting in densification and smoothness of the deposited film. The process provides dense, smooth amorphous silicon at high deposition rates. The top surface of deposited amorphous silicon has an average surface roughness less than 50 Å. Amorphous silicon with average surface roughness less than 10 Å has been obtained.

According to another aspect of the present invention, the DC sputtering process is used to deposit amorphous silicon for use as a hard mask material. A method of patterning a material layer includes forming a layer of amorphous silicon on a material layer according to the present DC sputtering process, forming a pattern in the layer of amorphous silicon, and etching the material layer wherein the pattern in the layer of amorphous silicon is transferred to the material layer. The low average surface roughness of the amorphous silicon hard mask is reflected in the low average surface roughness of the sidewalls of the etched material layer. Thus, amorphous silicon deposited by the present process is beneficially used to etch optical devices with stringent requirements for sidewall surface smoothness.

According to yet another aspect of the present invention, DC sputtered amorphous semiconductor materials are used as the high refractive index material in passive and active optical devices. In particular, amorphous silicon is useful as the core layer of optical devices. A method of forming optical devices includes forming a layer of an amorphous semiconducting material by the present DC sputtering process on a layer of material having a refractive index less than that of the amorphous semiconducting material, patterning the amorphous semiconducting material, and forming a layer of a material having a lower refractive index on top of the patterned layer of amorphous semiconducting material. In an alternative device design, the top layer of lower refractive index material is formed on top of unpatterned amorphous semiconducting material and an etching step patterns the top layer and partway through the thickness of the amorphous semiconducting material.

BRIEF DESCRIPTION OF THE DRAWINGS

FIG. 2a is a schematic cross section of a buried ridge planar optical device. FIGS. 2b and 2d are perspective schematics views illustrating process steps in fabricating the device of FIG. 2a using a hard mask formed according to embodiments of the present invention. FIG. 2c is a top down view of FIG. 2b.

DETAILED DESCRIPTION

A specialized physical vapor deposition process provides micron scale thick films of dense amorphous semiconducting materials with exceptionally smooth morphology. In particular, films of dense amorphous silicon can be used as a hard mask for etching optical and semiconductor devices and as a high refractive index material in optical devices.

Figure 1:
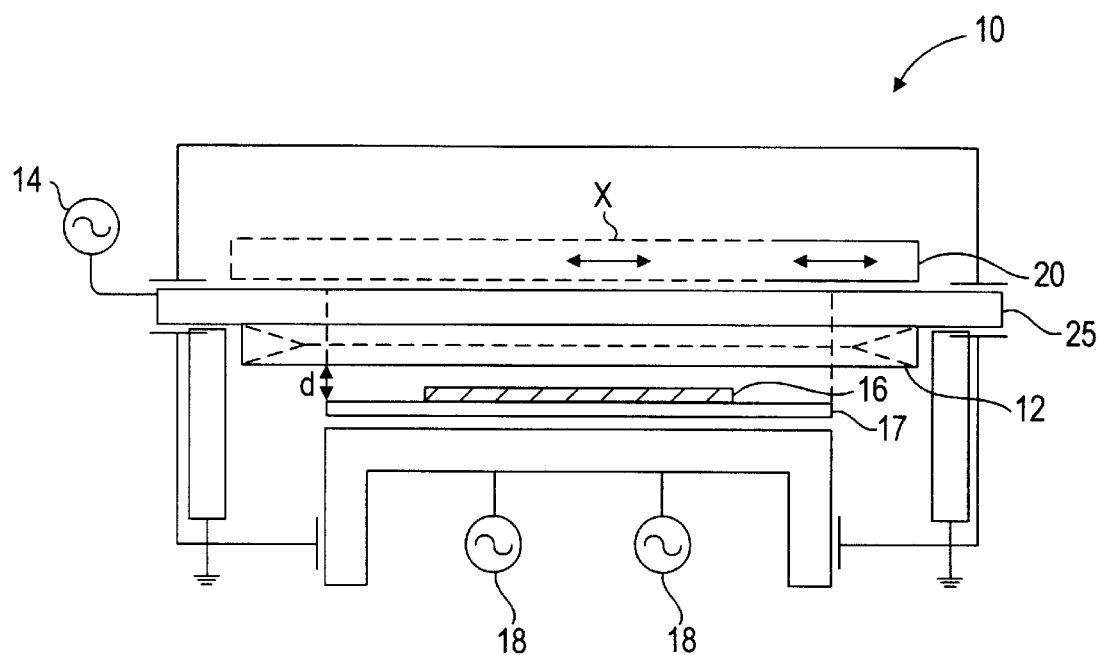
FIG. 1 is a schematic drawing of a physical vapor deposition apparatus in which a process, according to embodiments of the present invention, is performed.

An apparatus 10 for DC sputter deposition of amorphous silicon is illustrated schematically in FIG. 1. The apparatus includes many features in common with the RF sputtering apparatus for deposition of optical materials, that is described in commonly assigned U.S. application Ser. No. 09/633,307, the "prior" application, which is incorporated herein by reference. Apparatus 10 includes a sputter source target 12 which provides the source of crystalline intrinsic silicon to be deposited on substrate 16. Substrate 16 is positioned parallel to and opposite target 12. For the deposition of pure amorphous silicon, target 12 is composed, for example, of single crystal intrinsic silicon with low, less than about $10^{16}$–$10^{17}$/cm$^3$, concentration of dopants. The crystalline material of target 12 may be a single crystal or polycrystalline material. In practice, target 12 is a composite target fabricated from individual tiles, precisely bonded together on a backing plate with minimal separation. In one exemplary sputter target, the tiles are positioned with a common crystal orientation. Alternatively, target 12 is composed of very fine grained polysilicon in which the grain size is less than the target thickness.

A method of attaching tiles to a backing plate 25, forming target 12, is described in detail in the prior application. The backing plate is made of titanium, molybdenum, or other low expansion metal. The method includes sputter coating the back of the tiles and the portion of the backing plate under the tiles with a diffusion layer such as chrome or nickel and plasma spray coating the portion of the backing plate between the tiles or around the edges of the tile assembly with alumina or silica to prevent contamination of the deposited film by backing plate material. The complete target assembly also includes structures for cooling the target as described in U.S. Pat. No. 5,565,071 to Demaray et al, and incorporated herein by reference.

In FIG. 1 substrate 16 represents one or more layers which are to be patterned as a process step in the fabrication of a planar optical device, for example, a waveguide, or an integrated circuit device using an amorphous silicon hard mask. In the case of optical devices, the layers of substrate 16 may be deposited using the RF sputtering process of the prior application. Substrate 16 may include as a bottom layer a silicon wafer, a silicon wafer coated with a layer of silicon oxide formed by a vapor deposition process or by a thermal oxidation process, or a layer of glass or a glass-like material. Substrate 16 typically is supported on a holder or carrier sheet 17 that may be larger than substrate 16. As in the prior application, the area of target 12 is greater than the area on the carrier sheet on which deposition is accomplished. Target 12 is typically substantial in size, an exemplary target size being 550×650 mm. Using a large area target provides a film with uniform film thickness. The area of target 12 is at least about 1.5 times larger than the area over which a film with thickness nonuniformity less than about 5% is achieved.

In the present DC sputtering process, target 12 is sputtered under a condition of uniform sputter erosion. Multiple approaches to providing a uniform condition of sputter erosion of the target material can be used. A first approach is to sputter without magnetic enhancement. Such operation is referred to as diode sputtering. Using a large area target with a diode sputtering process, an amorphous silicon can be deposited with uniform film thickness over a central portion of an adjacent substrate area. In diode sputtering, to overcome a slow deposition rate, higher sputtering gas pressures are used than with methods that include magnetic enhancement. Other approaches to providing a uniform condition of sputter erosion rely on creating a large uniform magnetic field or a scanning magnetic field that produces a time-averaged, uniform magnetic field.

As illustrated in FIG. 1, apparatus 10 also includes a scanning magnet magnetron source 20 positioned above target 12 to create a time-averaged uniform magnetic field. Scanning magnetron source 20 is scanned back and forth across the target 12 as indicated by the arrows labeled X in FIG. 1. A scanning magnetron source used for DC sputtering of metallic films is described in U.S. Pat. No. 5,855,744 to Halsey, et. al., which is incorporated herein by reference, and in references therein. A scanning magnet magnetron source, is preferred to provide a uniform, wide area condition of target erosion. However, other approaches such as a rotating magnet or scanning electromagnet could alternatively be used.

Apparatus 10 further includes a switching DC power supply 14, for applying DC current to target 12 to generate a plasma in a background sputtering gas. Examples of suitable power supplies are provided by Commmunications Power Inc. (Montreal, Quebec, Canada). The methods according to the present invention take advantage of the unexpected consequences of the output profile of the switching DC power supply.

Switching DC power supplies include, as components, one or more silicon control rectifiers (SCR's) or similar devices. The SCR's are solid state relays that switch a higher voltage DC power supplied by the rectified AC wall current into a constant power lower voltage DC current output by the DC power supply. Switching on an SCR typically provides a low frequency AC ripple, in the range of between about 10 and 30 kHz superimposed on the DC current, at a power level of between about 5 and 10% of the total power. When the AC frequency of the AC ripple has a substantial overlap with the low frequency harmonics of the sputtering chamber, the resulting plasma exhibits substantial stored energy at multiple frequencies of the switching frequency of the SCR, in a phenomenon termed harmonic conversion. The larger the sputtering chamber, the more plasma modes contribute and the more efficient the harmonic conversion. Using a chamber suitable for a 550×650 mm target, the harmonics may have more than about 50% of the total AC process power at, for example, 30 to 90 kHz. The phenomenon provides two beneficial effects: (1) a high sputtering rate at a low applied DC voltage due to the additional AC frequency coupled to the series capacitance of the plasma load, and (2) addition of a low frequency component to the plasma that causes ions in the plasma to bombard both the target and the film being deposited, resulting in densification of the film and improved film smoothness. When the noise level of a switching power supply is below about 5–10%, the method may be practiced by deliberately removing output filters from the power supply to increase the AC power level. Alternatively, a separate discrete source of low frequency AC power may be coupled to the DC power supply 14, as understood by those skilled in the art.

Intrinsic silicon typically has a resistivity of greater than about 1 centimeter ($\Omega$cm), although very pure intrinsic silicon may have a resistivity that is much higher than 1 $\Omega$cm. The term intrinsic, as applied to semiconducting materials, is defined as a semiconductor in which the concentration of charge carriers is characteristic of the material itself instead of the content of any impurities it contains. DC sputtering is conventionally practiced with conducting targets composed of material that has a resistivity less than about 1 $\Omega$cm. The present inventors have recognized that using a switching DC power supply under conditions of harmonic conversion enables DC sputtering of high resistivity materials. Although the invention is described here specifically with respect to DC sputtering of intrinsic silicon, the present method can be applied to targets composed of any intrinsic, crystalline semiconducting matieral. Thus, for example, in addition to silicon, the present method can be used to deposit amorphous layers of germanium, silicon germanium, III–V semiconductors such as gallium arsenide, indium arsenide, and gallium phosphide, cadmium selenide, cadmium telluride, and ternary compounds, such as gallium indium phosphide.

According to embodiments of the present invention, a switching DC power supply and scanning magnet magnetron is used to DC sputter crystalline silicon targets to produce amorphous silicon hard mask material. Typical process conditions for the present method include a constant DC voltage of between about 100 and 800 V at a power level of between about 1 kW and about 10 kW. An inert gas, typically argon, or a mixture of argon with other inert gases is used as the sputtering gas. The base pressure in the chamber prior to deposition is typically less than $2\times10^{-7}$ Torr. Ar flow rates of between about 20 and 50 standard cubic centimeters per minute (sccm) are used. The distance between the target and the substrate, denoted by d in FIG. 1, varies between about 4 cm and 9 cm. The amorphous silicon hard mask material may be deposited by either a low temperature or a high temperature process. In the low temperature process, the substrate temperature is held constant at a temperature between about 100° C. and about 175° C. The low temperature process produces silicon that is truly amorphous as evidenced by the observation of three distinct modes in the Raman spectrum. The high temperature process uses a substrate temperature between about 300° C. and about 450° C. Silicon deposited by the high temperature process has some crystallinity as evidenced by the observation of only two Raman modes. Nonetheless, the high temperature material offers significant advantages for use as a hard mask material over LPCVD deposited silicon.

The present processes provide dense amorphous silicon at high deposition rates. For example, using a source to substrate distance of 6 cm, a deposition rate of 2.6 Å/kW-sec has been obtained. At a deposition power of 4 kW, such a rate allows a 2 micron thick layer to be deposited in about a half hour. Depending on the process conditions, the DC sputtering rate may be a factor of five or ten faster than typical silicon LPCVD deposition rates. Further, the deposited amorphous silicon has excellent morphology for use as a hard mask material for etching optical devices. The top surface of the amorphous silicon is smooth with an average surface roughness of less than 50 Å. As shown in Example 1 below, smooth amorphous silicon with average surface roughness less than 10 Å has been obtained. The bulk of the amorphous silicon film is free of so-called "columnar" structure, structure that appears like a close packed group of columns or grains in magnified cross sections of the film. Both top surface roughness and bulk film structure of the hard mask material would be undesirably transferred to the sidewalls of an etched structure during an etching process. In addition, the amorphous silicon hard mask material exhibits an etch selectivity of between about 8:1 and 10:1 with respect to silicon oxide in a typical trifluoromethane reactive ion (RIE) etch.

The density of the DC sputtered amorphous silicon is demonstrated by the resistance of the amorphous silicon to oxidation below the top surface. For example, an approximately 400 Å thick film of amorphous silicon with an about 7 Å thick outer oxide layer was baked at 650° C. for four hours. After baking, the material had an about 15 Å thick outer layer of silicon oxynitride as measured by ellipsometry. The absence of oxidation below the exposed surface is evidence of the density of the material and the lack of defects running through the material from top to bottom. In contrast PECVD amorphous silicon exposed to the same conditions would be expected to be oxidized through the entire thickness of the amorphous layer.

Optionally, the present DC sputtering process is augmented by additionally applying AC power to the substrate 16, resulting in so-called substrate bias. Apparatus 10 of FIG. 1 includes an additional power source 18 for introducing substrate bias. The benefits of substrate bias are essentially the same as described in the prior application, in which RF power was used instead of AC power. Substrate bias results in additional ions being accelerated from the plasma and bombarding the film as it is deposited, which augments the benefits described above of the harmonic conversion phenomenon of the present invention.

Figure 3A:
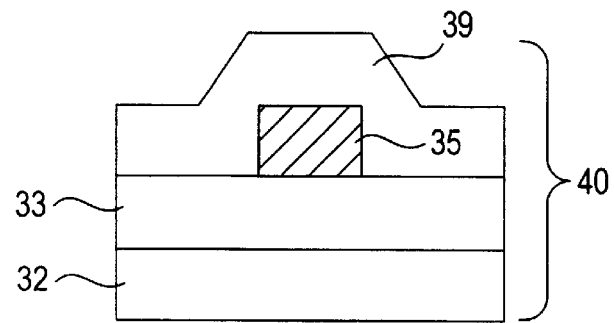
FIG. 3a is a schematic cross section of a surface ridge planar optical device.

The dense, amorphous silicon produced by the processes of the present invention is beneficially used as a hard mask material in forming planar optical waveguides. As is well known, planar optical devices consist, very generally, of a core region, typically bar shaped, of a certain refractive index, surrounded by a cladding region of a lower refractive index. In the case that the core material is doped with a photoluminescent active material, such as rare earth ions of erbium (Er) or praseodymium (Pr), and the conditions for amplification are met, such a structure may be used as a planar waveguide optical amplifier device. A schematic cross section of a wave guide 30 of a buried ridge design is shown in FIG. 2a and of a surface ridge wave guide device 40 is shown in FIG. 3a. Device 30 includes a core region 36 embedded in a cladding layer 34 atop a substrate 32. Another cladding layer 38 covers the embedded core region 36. Typically substrate 32 is a silicon wafer or a silicon wafer coated with a layer of silicon oxide formed by chemical vapor deposition or by a thermal oxidation process. Alternatively substrate 32 is a glass or glass-like material, quartz, a metal, a metal oxide or a plastic material. The core and cladding layers are typically composed primarily of silicon dioxide or other refractory oxides such as $Al_2O_3$, or combinations of oxides. The core materials may be doped with optically active ions. Other materials, such as low temperature glasses doped with alkali metals, boron or phosphorous may alternatively be used. Although substrate layer 32 and cladding layer 34 are shown as distinct layers in FIG. 2a, cladding layer 34 may be an oxide layer formed by oxidizing the top portion of a silicon wafer.

The initial process steps in fabricating device 30 are illustrated schematically in FIGS. 2b–2d. A layer of dense amorphous silicon is deposited according to the methods of the present invention on top of cladding layer 31 and patterned by conventional photolithography and dry etching to produce patterned hard mask 46 in FIG. 2b. Due to the high density and lack of columnar structure of the amorphous silicon provided by the present process, sidewall 46a and top surface 46c of hard mask 46 have low surface roughness. Smoothness of top surface 46c provides a smooth edge 46b, shown in a top view in FIG. 2c. Hard mask 46 is used to pattern cladding layer 31 by reactive ion etching. Through the etching process, any surface roughness in hard mask sidewall 46a or in hard mask edge 46b will be reflected in roughness of interior sidewall 34a in patterned cladding layer 34. The use of the present material with low average surface roughness for hard mask 46 allows a trench 37 with smooth sidewalls 34a to be formed. The smooth sidewalls 34a, in turn, enable core region 36 to be formed with smooth sidewalls. As discussed above, it has been observed that such sidewall smoothness is a major factor in reducing transmission loss of optical devices. The smoothness of hard mask 46 has additional benefits. If hard mask 46 is removed entirely by dry etching, any surface roughness in hard mask 46 is transferred to top surface 34b in patterned cladding layer 34, which limits waveguide performance when light is guided outside a core region, as in certain waveguide designs.

Silicon dioxide is very frequently used as the cladding layer in device 30. The large etch selectivity, between about 8:1 and 10:1 of dense amorphous silicon with respect to oxide, enables a relatively thin hard mask, much thinner than the cladding layer, to be used. The high deposition rate of the hard mask, coupled with the small thickness requirement, provides much faster throughput for fabrication processes as compared with use of conventional hard masks.

Figure 3B:
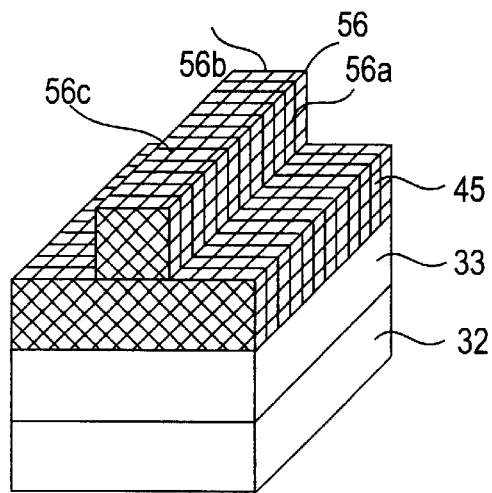
FIGS. 3b and 3c are perspective schematics views illustrating process steps in fabricating the device of FIG. 3a using a hard mask formed according to embodiments of the present invention.
Figure 3C:
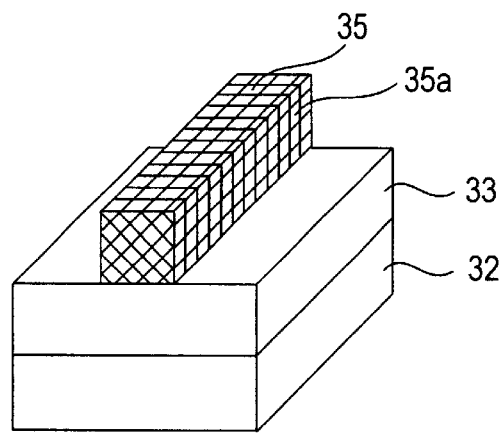

Similar benefits are realized when smooth dense amorphous silicon is used as a hard mask to form surface ridge optical device 40. The initial process steps in forming such surface ridge devices are shown schematically in FIGS. 3b and 3c. Patterned hard mask 56 with sidewalls 56a, top edge 56b, and top surface 56c, is formed on core layer 45 positioned atop cladding layer 33 on substrate 32. When hard mask 56 is used to etch the core layer, the resulting ridge structure 35 with sidewalls 35a results. The smoothness of hard mask sidewalls 56a and edge 56b are reflected in the smoothness of core sidewalls 35 when device 40 is an optical amplifier, core layer 45 is typically an oxide doped with Er and/or Pr ions. Rare earth ion doped oxides are hard materials that are notoriously difficult to etch by wet or dry methods. Since the hard mask material is removed to some extent during etching, long etching times for the doped core layers necessitate thicker hard masks as compared with the process for non doped materials, exacerbating problems of surface roughness. The dense smooth amorphous silicon provided by the present processes is particularly advantageous as a hard mask for etching rare earth doped oxide layers. As shown in FIG. 3a, a cladding layer 39 is deposited over ridge structure 35.

Figure 4:
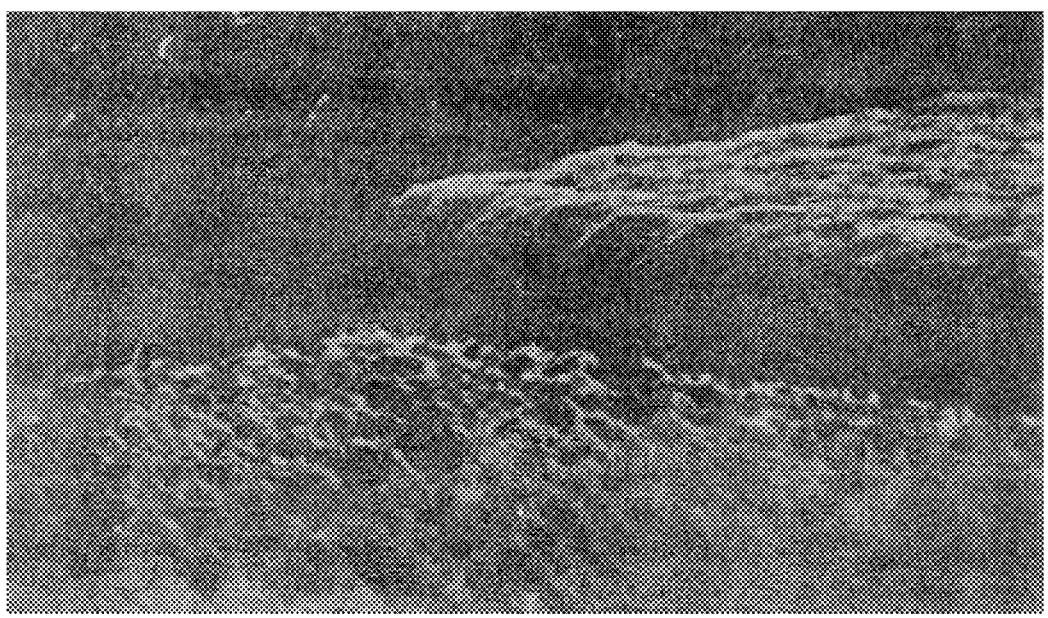
FIG. 4 is an SEM image of an amorphous silicon hard mask deposited by a method according to an embodiment of the present invention, after reactive ion etch.
Figure 5:
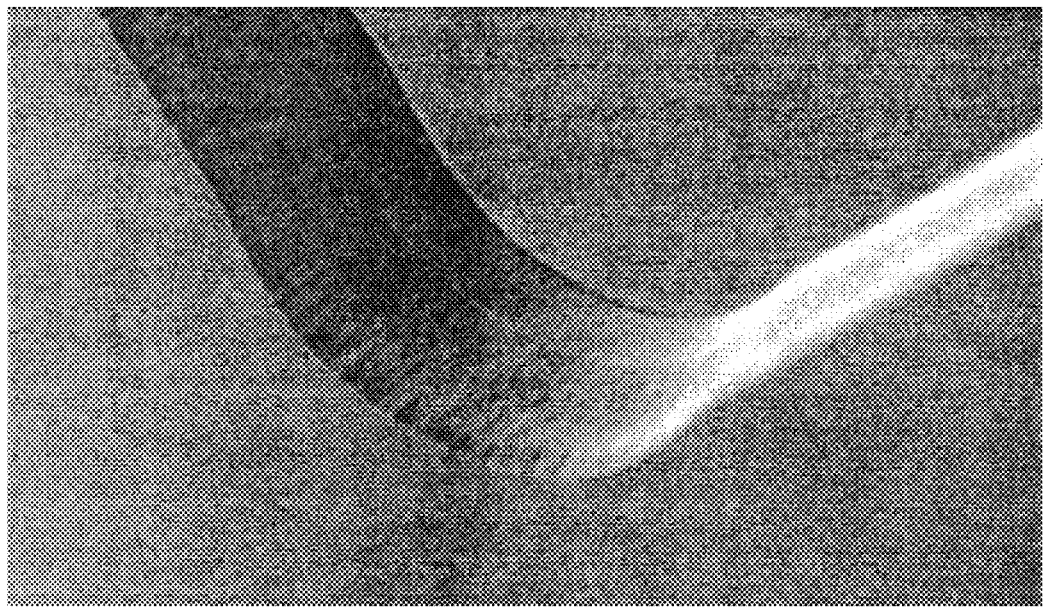
FIG. 5 is an SEM image of silicon hard mask deposited by a conventional LPCVD method of the prior art, after reactive ion etch.

FIG. 4 shows a scanning electron micrograph (SEM) image of the profile of an amorphous silicon hard mask after RIE etch. The hard mask pictured in FIG. 4 was deposited according to the low temperature DC sputtering process of the present invention as described in the Example below. In contrast, FIG. 5 shows an SEM image of a silicon hard mask after RIE etch, where the hard mask was deposited by a conventional low pressure chemical vapor deposition (LPCVD) process. As seen in the images, the top surface and sidewalls of the DC sputtered material in FIG. 4 is clearly smooth while the top surface of the LPCVD material shows extreme surface roughness. The average surface roughness ($R_a$) of the DC sputtered material of FIG. 4, as measured by atomic force microscopy (AFM), is 7.5 Å, which is dramatically smaller than the $R_a$ value of 283 Å of the LPCVD silicon. Thus, it can be seen the present DC sputtering process provides amorphous silicon that is well suited for use as a hard mask for etching features with the required sidewall smoothness for use in integrated circuit and optical devices.

In contrast to LPCVD deposited amorphous silicon, in which surface roughness increases with increasing film thickness, the surface roughness of amorphous silicon provided by the present DC sputtering process decreases with increasing film thickness. For example, the average surface roughness goes from several nanometers for very thin films to less than 10 Å for amorphous silicon of several microns in thickness. Therefore, the hard mask provided by the present process is advantageously used for argon etching where thick masks are required because the etch selectivity with respect to silicon oxide, for example, is only about 1:1.

Figure 6A:
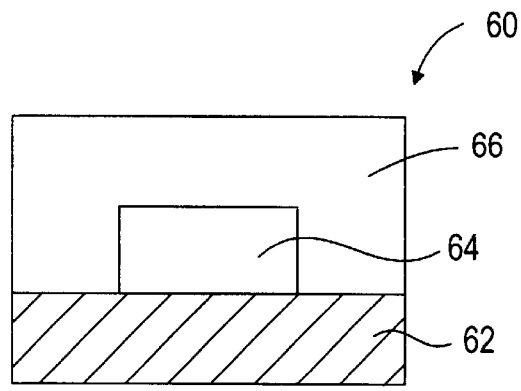
FIGS. 6a and 6b are schematic cross sections of surface ridge planar optical devices formed from amorphous silicon deposited according to embodiments of the present invention.

According to another embodiment of the present invention, the DC sputtered amorphous silicon forms the core region of optical devices having a large difference in refractive index between the core and cladding regions. FIG. 6a illustrates a cross section view of a surface ridge waveguide 60 having a core region 64 directly on top of a substrate 62, in this case used as a cladding layer. In device 60, substrate 62 is a dielectric material composed of quartz or alumina silicate or is an oxidized silicon wafer with an oxide layer of 5–10 μm or more. The present dense amorphous silicon forms core region 64. Cladding 66 may be composed of a reflow glass, a silicon oxide formed by a high temperature CVD process or an index matched polymer. Wave guide 60 may be formed by DC sputtering a layer of amorphous silicon on substrate 62 by the methods according to the present invention and patterning the amorphous silicon layer to form core region 64. Device 60 is completed by depositing a lower refractive index cladding layer 66 over patterned core layer 62 using standard methods for the cladding material. The dimensions of core region 64 are from about 0.5 to about 2 μm in height and about 0.5 to about 2 μm in width. When the core region is greater than about 0.5 μm in height by about 1 μm in width, for light at communication frequencies, on the order of 1 μm, the device will be multimode. Below about 0.5×1 μm, the device is single mode for communication frequencies.

As estimated by Lee et al., if the standard deviation of surface roughness of a core region can be improved to be less than 10 Å, the transmission loss of a waveguide of the general structure of device 60 can be reduced to less than 0.1 db/cm. As reported above, a mean surface roughness of 7.5 Å has been observed for a 2 μm thick dense amorphous silicon film deposited by the low temperature DC sputtering process. Thus, using DC sputtered amorphous silicon for core region 62 is expected to provide optical waveguides with very low transmission losses. In the low temperature DC sputtering deposition process, the substrate temperature is held at between about 100 and 175° C. This low process temperature is another significant advantage of the present process, allowing integration of optical devices with amorphous silicon cores with microelectronic devices that cannot tolerate high process temperatures.

Figure 6B:
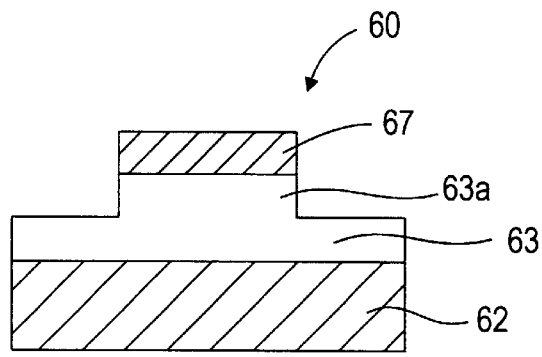

FIG. 6b illustrates a cross section view of an alternative surface ridge waveguide 65. Device 65 includes a region 63 of high refractive index core material on substrate 62 which has been patterned to have a top narrow core portion 63a and a bottom portion extending across substrate 63. The present DC sputtered amorphous silicon forms region 63. A layer of cladding material 67 tops narrow core portion 63a. Device 65 is fabricated by DC sputtering a layer of amorphous silicon on substrate 62, according to the present methods, depositing a layer of cladding material on top of the amorphous silicon layer, and etching through the cladding layer and partway through the amorphous silicon layer to form structure 65.

Figure 7:
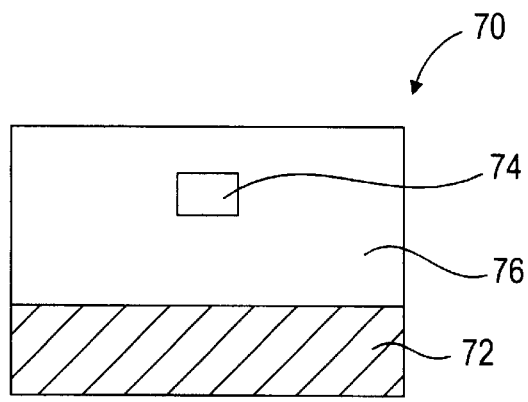
FIG. 7 is a schematic cross section of a microstrip planar optical device formed from amorphous silicon deposited according to embodiments of the present invention.

FIG. 7 illustrates a cross section view of a microstrip single mode waveguide 70 with an amorphous silicon core. Device 70 includes a core region 74 buried in a cladding region 76 atop a substrate 72. Substrate 72 is typically a silicon wafer but other substrates may be used. Cladding region 76 is typically a silicon oxide or a ceramic alloy including alumina. Oxides of silicon forming the cladding region may be deposited by the RF sputtering methods described in the prior application which provide methods to tailor refractive index of the deposited material. In this way, cladding material with refractive index between about 1.44 and 2 can be provided. Core region 74 is composed of amorphous silicon provided by the present low temperature DC sputtering process. In a single mode device, the cross section of core region 74 is between about 0.1×0.1 μm (height×width) and about 0.5×1 μm. The refractive index of the amorphous silicon is about 3.44. With the large refractive index difference between an amorphous silicon core and an oxide cladding layer and the small core dimension, light passing through optical device 70 is very strongly guided. In addition to having low transmission loss because of the sidewall smoothness of device 70 with a dense amorphous silicon core, the geometry of device 70 forces most of the light outside of the silicon core into the cladding layer. Although silicon is reasonably transparent, the cladding layer is even more transparent to light of communication frequencies than is the silicon core. As a consequence of the low transmission losses due to sidewall smoothness and guiding the light in the cladding layer, the length of core 74 in the direction perpendicular to the cross section of FIG. 7 can be from many centimeters to meters. Device 70 is fabricated by the same process stpes described for the fabrication of device 60.

An amplifier of the structure of device 70 can be obtained by using a material doped with up to several per cent of fluorescent rare earth ions for cladding region 76. The index of refraction of the core and cladding can be selected such that both pump light at 980 nm and signal light, for example, at 1550 nm, are strongly guided in the doped cladding. As discussed above, due to the relationship of the mode size and the core dimension, most of the light is outside the core, in the cladding. In this case, all of the waveguide material is subject to gain except for the small core region of silicon. Such a waveguide amplifier would be expected to have both a very low insertion loss due to the smooth sidewalls of the amorphous silicon core and very high pump photon efficiency due to the overlap of the pump light and the large area of the doped cladding. Thus the DC sputtered dense amorphous silicon according to the present invention is advantageously used to construct a variety of active and passive planar optical devices.

In addition, as described above, the present DC sputtering method can be applied generally to deposit amorphous intrinsic semiconducting materials. Such materials can alternatively form the core regions of optical devices such as devices 60, 65, or 70. Since different semiconducting materials have different refractive indices, the range of refractive index available through the practice of the present invention enables great flexibility in the design of active and passive planar optical devices.

The features and benefits of the present methods of DC sputtering of amorphous intrinsic semiconducting materials are further illustrated in the following example which is offered by way of illustration but not of limitation.

EXAMPLE 1

An AKT 1600 series PVD production reactor (Applied Komatsu Technology, Santa Clara, Calif.) modified for custom tile targets was used for DC sputter deposition of amorphous silicon. A wide area target of dimension 550×650 mm was fabricated from 20 single crystal silicon tiles, each 4 mm thick. The tiles were finished to a smooth surface, chemically cleaned, rinsed with hot deionized water, dried, and sputter coated with several microns of chrome on one side. The chrome coated sides were bonded to a thin plate of titanium as described above. The titanium backing plate was prepared for bonding by bead blasting, chemical cleaning, and plasma coating with silicon. The tiles and the backing plate were heated to approximately 180° C. and regions were coated with a layer of liquid indium. The tiles were precisely placed on the backing plate such that they were separated by no more than 0.02 inches from each other and from the edges of the region exposed to the plasma.

A 150 mm silicon wafer substrate was placed in the center of a 400×500 mm glass carrier sheet. 4 kW of power was applied to the target at a constant voltage of 350 V. A race-track shaped magnet of approximate dimension 150 mm×600 mm was swept over the face of the target at a rate of 4 seconds per complete cycle. The substrate was preheated to 150° C. and placed on a table controlled 150° C. The sputter gas was 99.99999% pure argon at a flow rate of about 35 sccm. The target to substrate distance was 6 cm. Deposition efficiency was approximately 2.6 Å/kW-sec. A 2 $\mu$m thick layer of amorphous silicon was deposited.

Composition of the sputtered amorphous silicon layer was monitored as a function of depth by Secondary Ion Mass Spectrometry (SIMS). Over the depth range from the surface to a depth of about 2000 Å, concentrations of atomic indium, aluminum, boron, and phosphorous were in the range of $10^{16}$ to $10^{17}$ atoms/cm$^3$ while the concentration of sodium was in the range of $10^{15}$ to $10^{16}$ atoms/cm$^3$, which demonstrates that intrinsic silicon with low dopant levels was deposited.

Atomic Force Microscopy (AFM) images of the DC sputtered silicon and of a comparison silicon sample deposited by LPCVD were obtained using a NanoScope III 5000 instrument (Digital Instruments, Veeco Metrology Group, Santa Barbara, Calif.). The instrument was calibrated against a traceable standard with an accuracy better than 2%. On both samples, a 40 $\mu$m×40 $\mu$m area at the center of the wafer was imaged. Roughness data, i.e. height of contact of a point on the surface, is reported below in Table 1 in terms of the root mean square value (RMS), average surface roughness ($R_a$), and maximum height peak-to-valley ($R_{max}$). Images of the DC sputtered and LPCVD silicon samples reported in Table 1, after patterning by a conventional trifluoromethane reactive ion etch, are shown in FIGS. 4 and 5, respectively.

TABLE 1

Surface roughness analysis

| Sample | RMS (Å) | $R_a$ (Å) | $R_{max}$ (Å) |
|---|---|---|---|
| DC sputtered silicon | 11.6 | 7.5 | 475 |
| LPCVD silicon | 359.5 | 283.0 | 3118 |

EXAMPLE 2

A sputter target composed of closely bonded tiles of intrinsic silicon having a resistivity of 4 to 20 Ωcm and a thickness of 4 mm was configured in a sputter chamber opposite a substrate of 400×500 mm composed of 0.7 mm thick Corning 1737 glass. The chamber was evacuated to high vacuum and filled with argon gas to a pressure of 2 millitorr. A DC switching supply was connected to the target and run at 2 kilowatts in the presence of a magnetron magnetic field having an in plane magnetic field intensity of approximately 400 gauss at the surface of the target and a track of approximately 1 cm in width and 100 cm in circular length.

The DC switching supply was seen to impress an AC frequency of 11 kHz on the target. In the presence of the induced plasma, harmonics of 22, 33, 44, and 55 up to 110-kHz, multiples of harmonics of the 11 kHz driving frequency, were observed. The intensity of the harmonic frequencies or overtones was a decreasing function of frequency. However the overtones exhibited significant intensity (more than 10% of the driving frequency) up to 200 kHz. The total intensity of the harmonics up to 110 kHz was more than 4 times the intensity of the parent frequency.

The result of the low frequency AC energy of the plasma is to accelerate the ion fraction, composed of argon ions, so that the ions impact the silicon film as it is being deposited. The low frequency applied to the target results in a lower intensity modulation at the substrate, resulting in a "soft" bombardment wherein the silicon ad-atoms are scattered forward, densifying and smoothing the film, but the argon ions are not implanted to any great extent in the film. Argon concentration data show that the film contains less than 0.1% argon, as deposited. The low argon concentration together with the high density smooth surface morphology and low stress of films of the resulting amorphous silicon demonstrate the effect of the low frequency hormonic energy as a means of conferring a beneficial ion bombardment during the deposition of the silicon film.

Although the present invention has been described in terms of specific materials and conditions, the description is only an example of the invention's application. Various adaptations and modifications of the processes disclosed are contemplated within the scope of the invention as defined by the following claims.

We claim:

1. A method of forming a layer of an amorphous semiconducting material on a substrate, the method comprising:

positioning a substrate opposite a planar target comprising an intrinsic crystalline semiconducting material;

applying DC power to the target in the presence of a gas, under a condition wherein the DC power is modulated by AC power, and under a condition of uniform target erosion, whereby a layer of amorphous semiconducting material is formed on the substrate; and applying AC power to the substrate.

2. A method of forming a layer of an amorphous semiconducting material on a substrate, the method comprising:

positioning a substrate opposite a planar target comprising an intrinsic crystalline semiconducting material;

applying DC power to the target in the presence of a gas, under a condition wherein the DC power is modulated by AC power, and under a condition of uniform target erosion, whereby a layer of amorphous semiconducting material is formed on the substrate; and wherein the area of the planar target is at least 1.5 times greater than the area of the substrate.

3. A method of forming a layer of an amorphous silicon on a substrate, the method comprising:

positioning a substrate opposite a planar target comprising intrinsic crystalline silicon; and applying DC power to the target in the presence of a gas, under a condition wherein the DC power is modulated by AC power, and in the presence of a time-averaged uniform magnetic field created by a moving magnetron source, whereby a layer of amorphous silicon material is formed on the substrate, wherein the target is composed of tiles positioned with a uniform crystal orientation.

4. A method of forming an optical device comprising:

forming a layer of amorphous silicon on a first layer of material, the first layer having an index of refraction less than the index of refraction of the amorphous silicon material, the process of forming the layer of amorphous silicon comprising:

positioning the first layer opposite a planar target comprising intrinsic crystalline silicon; and applying DC power to the target in the presence of a gas, under a condition wherein the DC power is modulated by AC power, and under a condition of uniform target erosion, whereby a layer of amorphous silicon is formed on the first layer;

forming a top layer of a material having a lower index of refraction than the index of refraction of the amorphous silicon on top of the layer of amorphous silicon; and patterning the top layer and partway through the thickness of the amorphous silicon to form the optical device.

\* \* \* \* \*